United States Patent
Jin et al.

(10) Patent No.: US 6,751,447 B1
(45) Date of Patent: Jun. 15, 2004

(54) ADAPTIVE DIGITAL PRE-DISTORTION CIRCUIT USING OUTPUT REFERENCE SIGNAL AND METHOD OF OPERATION

(75) Inventors: Hang Jin, Plano, TX (US); Joseph R. Cleveland, Richardson, TX (US)

(73) Assignee: Samsung Electronics Cop., Ltd., Suwon (KR)

(*) Notice: Subject to any disclaimer, the term of this patent is extended or adjusted under 35 U.S.C. 154(b) by 0 days.

(21) Appl. No.: 09/474,946

(22) Filed: Dec. 30, 1999

(51) Int. Cl.[7] .................. H04B 7/005; H01Q 11/12
(52) U.S. Cl. .................. 455/114.3; 455/63; 455/115; 455/119; 330/136; 330/149; 375/297; 375/296
(58) Field of Search .................. 455/114.3, 115.1, 455/119, 121, 126–127.1, 63, 116; 330/149, 136, 151; 375/295, 296, 297

(56) References Cited

U.S. PATENT DOCUMENTS

| | | | | |
|---|---|---|---|---|
| 5,486,789 A | * | 1/1996 | Palandech et al. | 330/149 |
| 5,949,283 A | * | 9/1999 | Proctor et al. | 330/149 |
| 6,246,865 B1 | * | 6/2001 | Lee | 455/114.3 |
| 6,266,517 B1 | * | 7/2001 | Fitzpatrick et al. | 455/114.3 |
| 6,275,685 B1 | * | 8/2001 | Wessel et al. | 455/126 |
| 6,288,610 B1 | * | 9/2001 | Miyashita | 330/149 |
| 6,449,466 B1 | * | 9/2002 | Jin et al. | 455/126 |
| 6,512,417 B2 | * | 1/2003 | Booth et al. | 330/149 |
| 2002/0080891 A1 | * | 6/2002 | Ahn et al. | 375/297 |
| 2003/0076894 A1 | * | 4/2003 | Jin et al. | 375/296 |
| 2004/0017859 A1 | * | 1/2004 | Sills et al. | 375/296 |

\* cited by examiner

*Primary Examiner*—Sinh Tran
*Assistant Examiner*—Kamran Afshar

(57) ABSTRACT

There is disclosed a pre-distortion correction circuit for use in an RF transmitter having a transmit path for receiving and amplifying an RF input signal. The pre-distortion correction circuit modifies distortion in the RF output signal caused by an RF power amplifier in the transmit path. The pre-distortion circuit comprises: 1) feedback circuitry coupled to an output of the transmit path for demodulating and digitizing the distorted RF output signal to thereby produce a first demodulated digital output signal; and 2) a pre-distortion calculation controller coupled to the feedback circuitry for comparing the first demodulated digital output signal to adjacent channel power (ACP) profile data stored in the pre-distortion calculation controller and generating therefrom pre-distortion correction values. The pre-distortion correction values are used to pre-distort the RF input signal to thereby cause the RF output signal to more closely resemble an ideal RF output signal within the limits of the ACP profile.

21 Claims, 7 Drawing Sheets

ADAPTIVE DIGITAL PRE-DISTORTION CIRCUIT USING OUTPUT REFERENCE SIGNAL AND METHOD OF OPERATION

CROSS-REFERENCE TO RELATED APPLICATIONS

The present application is related to that disclosed in co-pending U.S. patent application Ser. No. 09/224,193 for "ADAPTIVE DIGITAL PRE-DISTORTION CORRECTION CIRCUIT FOR USE IN A TRANSMITTER IN A DIGITAL COMMUNICATION SYSTEM AND METHOD OF OPERATION," filed on Dec. 30, 1998. U.S. patent application Ser. No. 09/224,193 is hereby incorporated by reference in the present disclosure as if fully set forth herein.

TECHNICAL FIELD OF THE INVENTION

The present invention is directed, in general, to wireless networks and, more specifically, to an adaptive digital pre-distortion correction circuit for use in an RF transmitter.

BACKGROUND OF THE INVENTION

Every wireless network base station has an RF power amplifier for transmitting voice and/or data signals to mobile units (i.e., cell phones, portable computers equipped with cellular modems, pagers, and the like) and a receiver for receiving voice and/or data signals from the mobile units. The design of an RF power amplifier (PA) for digital radio systems is controlled by two overriding criteria: 1) The RF power amplifier should transmit sufficient RF output power to serve the cell site of the base station in which it is installed, but should also use the minimum amount of input DC power in doing so; and 2) The adjacent channel power (ACP) noise (distortion) should be under certain limits (mask), that are usually defined in a standard (i.e., ACP profile)

In most cases, these two criteria are contradictory. ACP noise results from non-linear effects, such as over-driving the power amplifier into its non-linear region (clipping). Spurious spectral components are introduced when a signal peak is sufficiently large to over-drive or to saturate an RF amplifier in the transmitter. In order to meet the ACP profile, the RF transmitters in wireless networks in which digital signals have high peak-to-mean ratios, such as CDMA and multi-carrier systems, are frequently "backed off" from full power (or peak power) to avoid operating the transmitter in non-linear conditions. In these digital systems that have high peak-to-mean signal ratios, the RF power amplifier thus needs a considerable amount of power "headroom" to accommodate the peak power. For example, RF power amplifiers in some CDMA systems need more than 10dB of headroom space to protect the peak CDMA signal power from clipping. Unfortunately, leaving this much overhead significantly reduces the power efficiency of the RF power amplifier. This increases the DC power consumption, the base transceiver subsystem cooling requirements, the overall system volume, weight, and cost.

For a particular digital radio system, such as cellular CDMA or TDMA, the transmitter ACP profile is defined in the system standard. Generally speaking, the actual ACP profile of an RF power amplifier is not the same as the ACP profile required by the standard. The power amplifier ACP profile is determined more or less by the power amplifier device characteristics, operating modes, and signal behaviors. For example, the out-of-band spurious components generated from a CDMA signal appear like white noise: the power density does not change significantly with frequency. However, the ACP profile defined in, for example, the IS95 CDMA system standard does not require a constant spurious power density over different frequencies. The whole frequency spectrum is divided into a few blocks and the standard ACP profile changes significantly from one block to the next.

This may lead to situations in which the power amplifier output power level is dictated by the ACP noise at a few frequency points where the standard ACP profile appears the most stringent. However, there may still be relatively large ACP noise margins at many other frequencies. In a sense, the power amplifier ACP noise is not optimized to make full usage of the ACP profile under the applicable standard. The excess ACP noise margin at most frequencies is not used.

Prior art solutions for allowing RF power amplifiers to operate more closely to full power in systems having high peak-to-mean digital signal ratios typically use a digital pre-distortion adjustment circuit that uses the input signal, the output signal, and the standard ACP profile to optimize the performance of the RF amplifier to more closely match the desired standard ACP profile. These conventional digital pre-distortion methods sample, digitize, synchronize, and compare input and output signals to determine the signal distortion. The amount of correction is usually based on the difference between the input and output signals.

However, comparison of input and output signals requires sophisticated circuits for synchronizing the signals over time and temperature in order to extract correct signal distortion information. In addition, the pre-distortion correction step, which is based upon the difference between the input and output signals, may not yield the optimum correction in terms of efficiency, speed, and amount of required circuitry.

There is therefore a need in the art for improved wireless networks that use more efficient RF power amplifiers. In particular, there is a need for improved RF power amplifiers that can operate more closely to full power in systems having high peak-to-mean digital signal ratios. More particularly, there is a need for power control apparatuses that make RF power amplifiers more efficient by utilizing the available ACP noise margins under the applicable standard ACP profile. There is a further need for power control apparatuses that are not limited by circuitry required to synchronize the RF input and RF output signals in order to generate pre-distortion correction signals.

SUMMARY OF THE INVENTION

To address the above-discussed deficiencies of the prior art, it is a primary object of the present invention to provide a pre-distortion correction circuit for use in an RF transmitter having a transmit path capable of receiving and amplifying an RF input signal. The pre-distortion correction circuit modifies distortion in the RF output signal caused by an RF power amplifier in the transmit path. In an advantageous embodiment of the present invention, the pre-distortion circuit comprises: 1) feedback circuitry coupled to an output of the transmit path capable of demodulating and digitizing the distorted RF output signal to thereby produce a first demodulated digital output signal; and 2) a pre-distortion calculation controller coupled to the feedback circuitry capable of comparing the first demodulated digital output signal to adjacent channel power (ACP) profile data associated with the pre-distortion calculation controller and generating therefrom pre-distortion correction values capable of being used to predistort the RF input signal to thereby cause the RF output signal to more closely resemble an ideal RF output signal within the limits of the ACP profile.

Advantageously, no synchronization circuitry is needed on either the input of the output in order to pre-distort the RF input signal. Instead, the pre-distortion correction values used to generate an ideal RF output signal are derived solely from the actual RF output signal and the applicable ACP profile limits.

According to one embodiment of the present invention, the transmit path comprises demodulation circuitry capable of demodulating and digitizing the RF input signal to thereby produce a first demodulated digital input signal.

According to another embodiment of the present invention, the pre-distortion correction values are used to pre-distort the first demodulated digital input signal produced from the input RF signal.

According to an intermediate frequency (IF) embodiment of the present invention, the feedback circuitry comprises a first intermediate frequency (IF) demodulator and the first demodulated digital output signal comprises a first digital IF output signal.

Still according to the IF embodiment of the present invention, the demodulation circuitry in the transmit path comprises a second intermediate frequency (IF) demodulator and the first demodulated digital input signal comprises a first digital IF input signal.

Further according to the IF embodiment of the present invention, the pre-distortion correction values are used to pre-distort the first digital IF input signal produced from the input RF signal.

According to a baseband embodiment of the present invention, the feedback circuitry comprises a first baseband demodulator and the first demodulated digital output signal comprises a first digital baseband output signal.

Still according to the baseband embodiment of the present invention, the demodulation circuitry in the transmit path comprises a second baseband demodulator and the first demodulated digital input signal comprises a first digital baseband input signal.

Further according to the baseband embodiment of the present invention, the pre-distortion correction values are used to pre-distort the first digital baseband signal produced from the input RF signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network.

Figure 1:
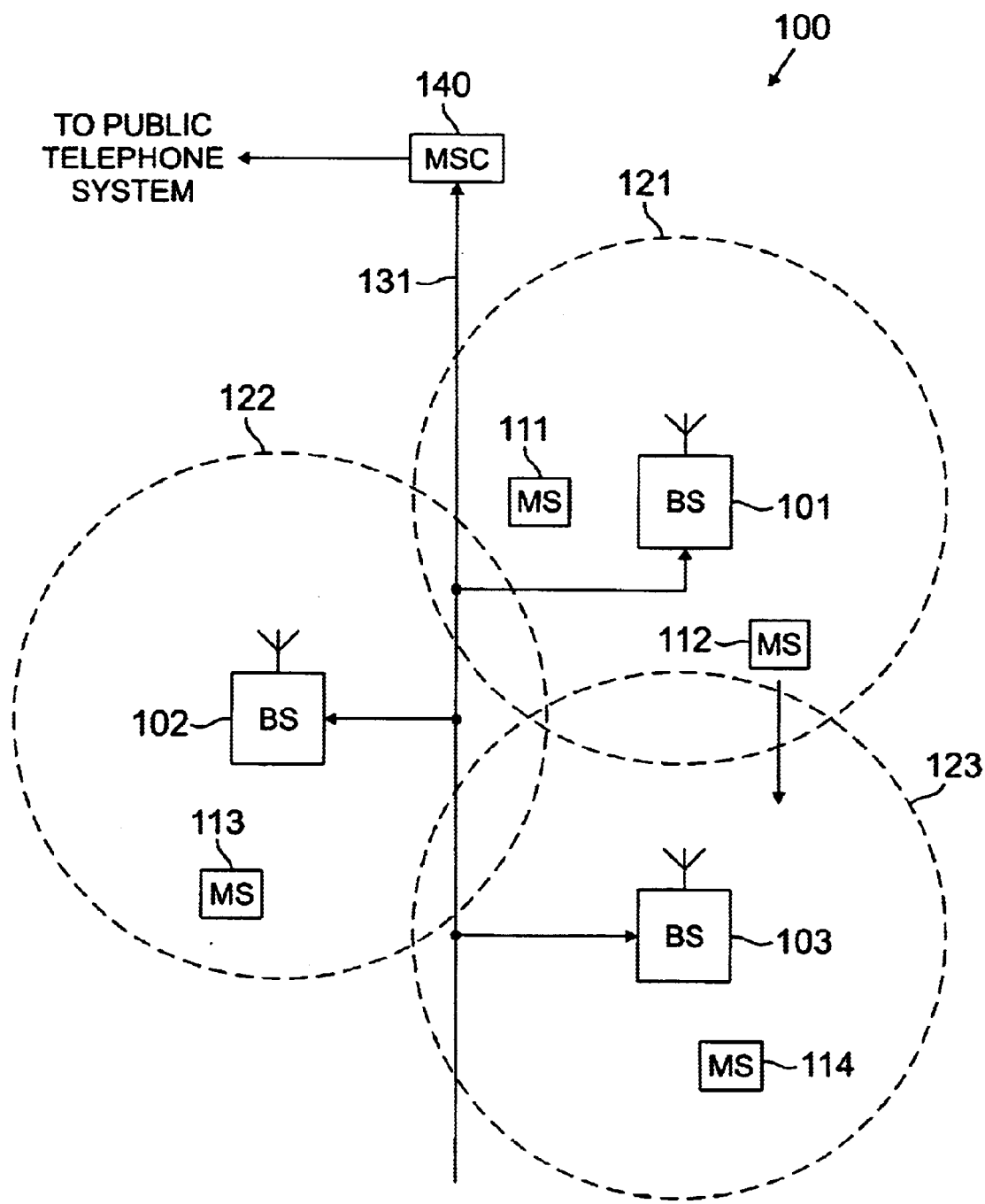
FIG. 1 illustrates an exemplary wireless network according to one embodiment of the present invention.

FIG. 1 illustrates exemplary wireless network 100 according to one embodiment of the present invention. The wireless telephone network 100 comprises a plurality of cell sites 121–123, each containing one of the base stations, BS 101, BS 102, or BS 103. Base stations 101–103 are operable to communicate with a plurality of mobile stations (MS) 111–114. Mobile stations 111–114 may be any suitable cellular devices, including conventional cellular telephones, PCS handset devices, portable computers, metering devices, and the like.

Dotted lines show the approximate boundaries of the cells sites 121–123 in which base stations 101–103 are located. The cell sites are shown approximately circular for the purposes of illustration and explanation only. It should be clearly understood that the cell sites may have other irregular shapes, depending on the cell configuration selected and natural and man-made obstructions.

In one embodiment of the present invention, BS 101, BS 102, and BS 103 may comprise a base station controller (BSC) and one or more base transceiver sub-systems (BTS). Base station controllers and base transceiver subsystems are well known to those skilled in the art. A base station controller is a device that manages wireless communications resources, including the base transceiver subsystem, for specified cells within a wireless communications network. A base transceiver subsystem comprises the RF transceivers, antennas, and other electrical equipment located in each cell site. This equipment may include air conditioning units, heating units, electrical supplies, telephone line interfaces, and RF transmitters and RF receivers.

In a typical wireless network, a base transceiver subsystem is at the center of each cell site. Frequently, multiple base transceiver subsystems may be connected to a single base station controller and multiple base station controllers may be connected to a single mobile switching center, such as mobile switching center (MSC) 140. However, for the purpose of simplicity and clarity in explaining the operation of the present invention, the base transceiver subsystem(s) and the associated base station controller(s) for each of cells 121, 122, and 123 are collectively represented by BS 101, BS 102 and BS 103, respectively.

BS 101, BS 102 and BS 103 transfer voice and data signals between each other and the public telephone system (not shown) via communications line 131 and mobile switching center (MSC) 140.

Mobile switching center 140 is well known to those skilled in the art. Mobile switching center 140 is a switching device that provides services and coordination between the subscribers in a wireless network and external networks, such as the public telephone system. Communications line 131 may be any suitable connection means, including a T1 line, a T3 line, a fiber optic link, a network backbone connection, and the like. In some embodiments of the present invention, communications line 131 may be several different data links, where each data link couples one of BS 101, BS 102, or BS 103 to MSC 140.

In the exemplary wireless network 100, MS 111 is located in cell site 121 and is in communication with BS 101, MS 113 is located in cell site 122 and is in communication with BS 102, and MS 114 is located in cell site 123 and is in communication with BS 103. The MS 112 is also located in cell site 121, close to the edge of cell site 123. The direction arrow proximate MS 112 indicates the movement of MS 112 towards cell site 123. At some point, as MS 112 moves into cell site 123 and out of cell site 121, a "handoff" will occur.

As is well known, the "handoff" procedure transfers control of a call from a first cell to a second cell. For example, if MS 112 is in communication with BS 101 and senses that the signal from BS 101 is becoming unacceptably weak, MS 112 may then switch to a BS that has a stronger signal, such as the signal transmitted by BS 103. MS 112 and BS 103 establish a new communication link and a signal is sent to BS 101 and the public telephone network to transfer the on-going voice, data, or control signals through BS 103. The call is thereby seamlessly transferred from BS 101 to BS 103. An "idle" handoff is a handoff between cells of a mobile device that is communicating in the control or paging channel, rather than transmitting voice and/or data signals in the regular traffic channels.

Figure 2:
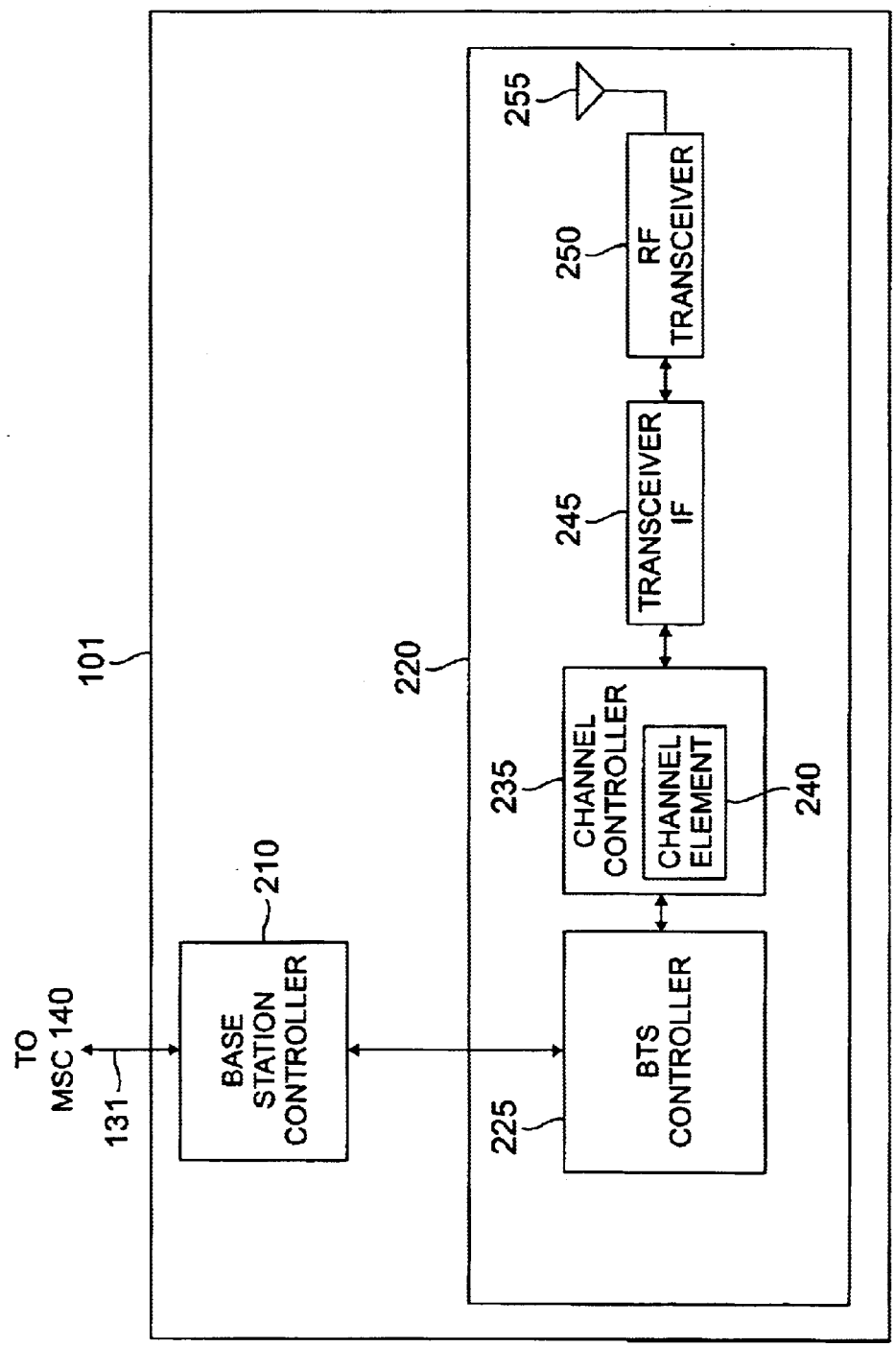
FIG. 2 illustrates in greater detail an exemplary base station according to one embodiment of the present invention.

FIG. 2 illustrates in greater detail exemplary base station 101 in accordance with one embodiment of the present invention. Base station 101 comprises base station controller (BSC) 210 and base transceiver subsystem (BTS) 220. Base station controllers and base transceiver subsystems were described previously in connection with FIG. 1. For the purposes of simplicity and clarity in explaining the operation of the present invention, only a single exemplary base transceiver subsystem and a single exemplary base station controller are shown in FIG. 2. BSC 210 manages the resources in cell site 121, including BTS 220. BTS 220 comprises BTS controller 225, channel controller 235, which contains one or more representative channel elements 240, transceiver interface (IF) 245, RF transceiver unit 250, antenna array 255, and channel monitor 260.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. Transceiver IF 245 transfers the bi-directional channel signals between channel controller 235 and RF transceiver unit 250.

Antenna array 255 transmits forward channel signals received from RF transceiver unit 250 to mobile stations in the coverage area of BS 101. Antenna array 255 also sends to transceiver 250 reverse channel signals received from mobile stations in the coverage area of BS 101. In a preferred embodiment of the present invention, antenna array 255 is one sector of a multi-sector antenna, such as a three sector antenna assembly in which each antenna sector is responsible for transmitting and receiving in a 120° arc of coverage area. Additionally, RF transceiver 250 may contain an antenna selection unit to select among different antennas in antenna array 255 during both transmit and receive operations. In one embodiment of the present invention, antenna array 255 may comprise an adaptive antenna array or "smart" antenna array.

To increase the efficiency of the RF transmitters in RF transceiver 250, the present invention implements an adaptive digital pre-distorter (ADPD) circuit that samples the RF transmitter output signal and compares the output samples to the ACP profile of an applicable standard. The present invention then determines the pre-distortion adjustments required to drive the power amplifier in order to maintain an ideal ACP output profile within the ACP profile of the applicable standard. The adaptive pre-distortion circuit according to the present invention does not require samples of the input signal for synchronization purposes or for calculation of pre-distortion adjustments. The present invention may be implemented in any type of digital modulation scheme, including TDMA, CDMA, GSM, NCDMA, multi-carrier signals, and even modems.

Figure 3:
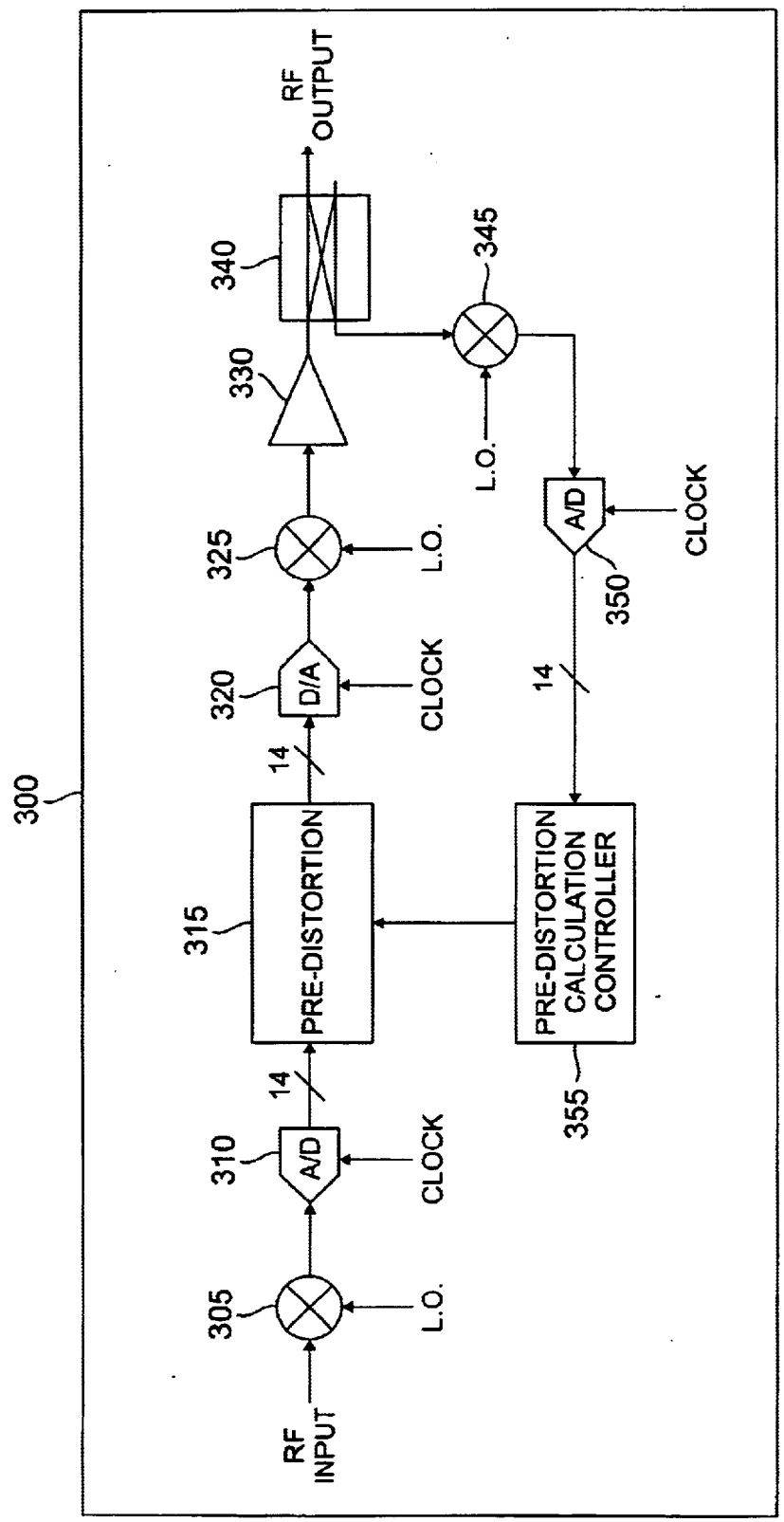
FIG. 3 illustrates selected portions of an exemplary RF transmitter for use in the exemplary base station according to one embodiment of the present invention.

FIG. 3 illustrates selected portions of exemplary RF transmitter 300 for use in RF transceiver unit 250 according to one embodiment of the present invention. RF transmitter 300 contains a transmit path that receives an RF input signal from the RF power amplifier (PA) driver, not shown, and generates an RF output signal that is sent to antenna array 255. The transmit path elements in RF transmitter 300 comprise demodulator 305, analog-to-digital converter (ADC) 310, pre-distortion circuit 315, digital-to-analog converter (DAC) 320, RF modulator 325, RF power amplifier (PA) 330, and RF coupler (RFC) 340.

RF transmitter 300 also contains a pre-distortion adjustment feedback loop that samples the RF output signal, compares the samples to the required ACP profile, and generates a pre-distortion adjustment signal that adjusts subsequent samples of an intermediate frequency (IF) input signal. The pre-distortion correction feedback loop elements in RF transmitter 300 comprise RF demodulator 345, ADC 350, and pre-distortion calculation controller 355. The applicable ACP profile varies according to the communications standard to which wireless network 101 must conform. For example, the ACP profile may comprise the ACP noise limitations (ACP "mask") under the IS95 CDMA system standard.

Demodulator 305 demodulates an RF input signal using a reference RF carrier signal from a local oscillator (LO) (not shown) to produce an intermediate frequency (IF) analog signal. ADC 310 converts the IF analog signal from demodulator 305 to a fourteen bit IF digital signal using the system clock signal (Clock) as reference.

Pre-distortion circuit 315 adds a pre-distortion error correction signal to the IF digital signal before sending the adjusted or pre-distorted IF digital signal to DAC 320. The pre-distortion distortion error correction is based on the amplitude and phase differences between the desired ACP profile and the distorted output signal as generated by pre-distortion calculation controller 355 and described in greater detail below. Pre-distortion circuit 315 adjusts the digitized IF output from ADC 310 according to the pre-distortion adjustment signals ($A_m$, $\Delta A_m$, and $\Delta\phi$) from pre-distortion calculation controller 355, providing an adjusted output which is within the desired ACP profile. More specifically, pre-distortion circuit 315 uses the amplitude, $A'_m$, of the newly received input signal and the reference amplitude $A_m$, amplitude correction $\Delta A_m$, and phase correction, $\Delta\phi$, signals from pre-distortion calculation controller 355, to identify appropriate entries in an internal look-up table (LUT) for distortion compensation adjustments. Pre-distortion circuit 315 then modifies its input signal according to the distortion adjustments to generate the desired pre-distorted signal for output to DAC 320.

DAC 320 samples the digital bit stream from pre-distortion circuit 315 using Clock reference signal and converts the digital bit stream to an analog signal for input to RF modulator 325. The LO input to RF modulator 325 is the RF reference carrier signal. Thus, RF modulator 325 outputs an RF signal modulated by the IF signal. Next, RF PA 330 amplifies the RF signal from RF modulator 325 to a power level suitable for transmission. The amplified modulated RF output signal is then sent to antenna array 255 through RFC 340.

Excluding pre-distortion circuit 315, those skilled in the art will recognize that the above-described demodulation, modulation, and amplification steps are common operations in conventional RF transmitters. When the amplitude of the RF input signal is relatively low, RF PA 330 operates well within its linear region and introduces little or no distortion in the RF output signal sent to antenna array 255. However, when operating in the linear region, RF PA 330 may be very inefficient in terms of power consumption. Thus, one goal is to have the input signal to RF PA as high as possible in order to improve the efficiency of the power amplifier.

As the amplitude of the RF input signal rises, PA 330 begins to saturate (i.e., operates in a non-linear manner) and distortion is introduced in the RF output signal sent to antenna array 255. This distortion includes adjacent channel power (ACP) noise that must be limited at the frequencies of interest to an amount less than the ACP profile (i.e., "mask") specified in the applicable system standard.

The pre-distortion adjustment signal is determined by the operation of the feedback path comprising demodulator 345, ADC 350, and pre-distortion calculation controller 355. RFC 340 sends a copy of the RF output signal to RF demodulator 345. The other input to RF demodulator 345 is the same LO reference signal used by RF demodulator 305 and RF modulator 325. RF demodulator 345 provides a scaled version of the IF analog signal generated by DAC 320, plus possible distortion introduced by RF PA 330. ADC 350 converts the scaled, distorted IF analog signal to digital values that are read by pre-distortion calculation controller 355, described in greater detail below.

Figure 4:
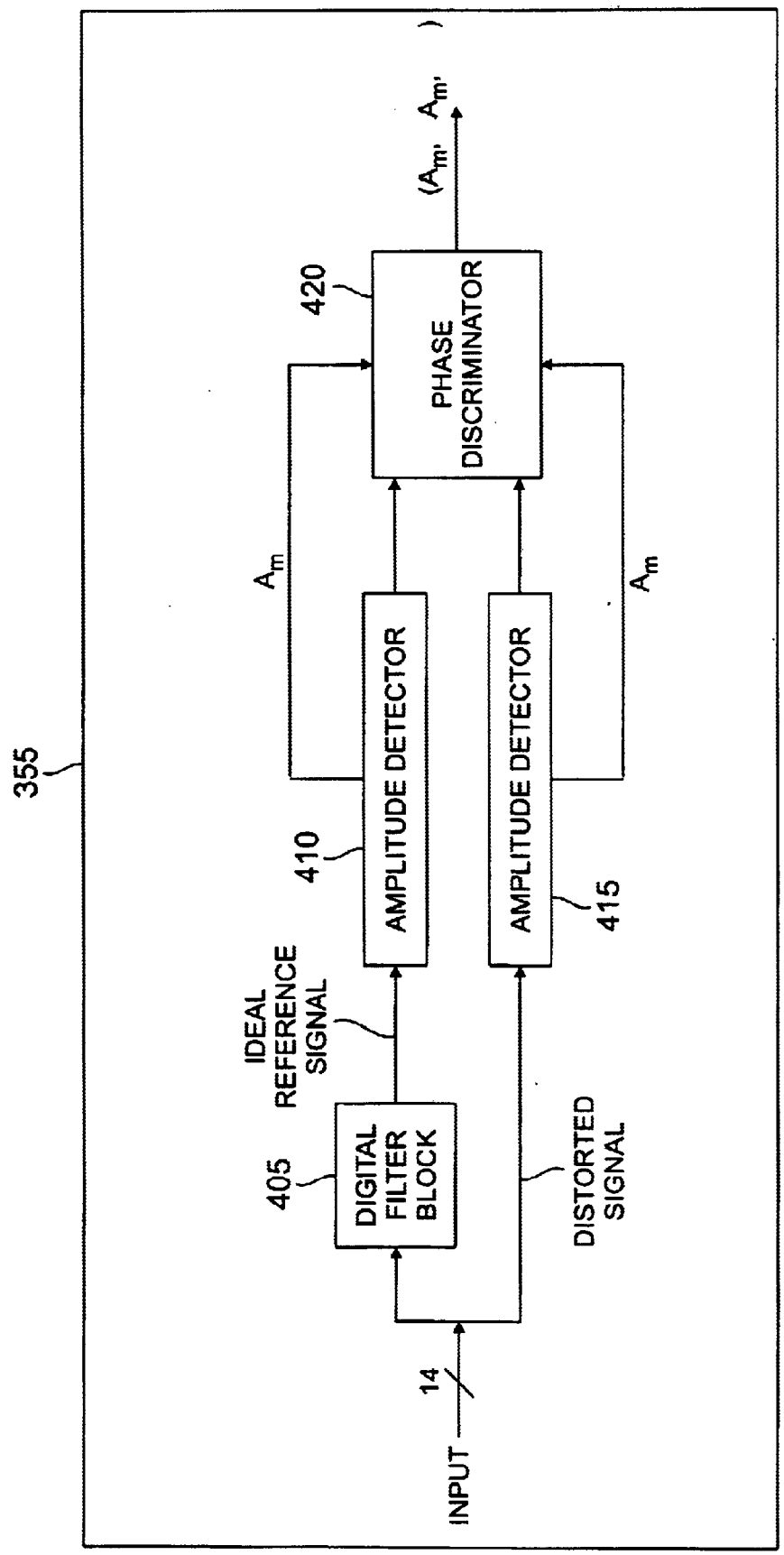
FIG. 4 illustrates an exemplary pre-distortion calculation controller in greater detail according to one embodiment of the present invention.

FIG. 4 illustrates exemplary pre-distortion calculation controller 355 in greater detail according to one embodiment of the present invention. At every amplitude, $A_m$, pre-distortion calculation controller 355 determines the signal distortion, represented by an amplitude difference, $\Delta A_m$, and a phase difference, $\Delta\phi$, introduced by PA 330. Pre-distortion calculation controller 355 comprises two signal paths for digitized IF signals from ADC 350. One path comprises digital filter block 405, amplitude detector 410, and phase discriminator 420. The second path comprises amplitude detector 415 and phase discriminator 420. Phase discriminator 420 provides pre-distortion adjustment signals for input to pre-distortion circuit 315.

Digital filter block 405 receives the distorted digitized IF signal from ADC 350 and adjusts it with regard to the applicable ACP profile to provide an ideal reference signal as its output. The ACP profile data that applies to BS 101 is stored in digital filter block 405. Digital filter block 405 generates the ideal reference signal by maintaining a buffer region between the allowed ACP profile power levels and the actual output of digital filter block 405. Digital filter block 405 filters out spurious emissions in the distorted signal, deriving an ideal reference signal that is below the ACP profile levels by a system selected buffer region. The ideal reference signal from digital filter block 405 is supplied as an input to amplitude detector 410. Amplitude detector 410 determines the amplitude ($A_M$) of the ideal reference signal and then transfers $A_M$ and the ideal reference signal to phase discriminator 420 for further processing.

In a similar manner, amplitude detector 415 directly processes the distorted digitized IF signal from ADC 350 to provide a distorted signal and distorted amplitude signal ($A_m'$) for input to phase discriminator 420.

Phase discriminator 420 determines the amplitude and phase distortion (or differences) between the distorted signal and the ideal reference signal, to provide pre-distortion signals for input to pre-distortion circuit 315. Phase discriminator 420 generates an amplitude difference signal, $\Delta A_m$, which represents the amplitude difference between the ideal reference signal and the distorted signal, $\Delta A_m = A_m - A_m'$. Phase discriminator 420 determines the phase difference, $\Delta\phi$, between the ideal reference signal and the distorted signal using any known circuit or technique. Pre-distortion calculation controller 355 provides $A_m$, $\Delta A_m$, and $\Delta\phi$ as inputs to pre-distortion circuit 315, as previously described.

Figure 5:
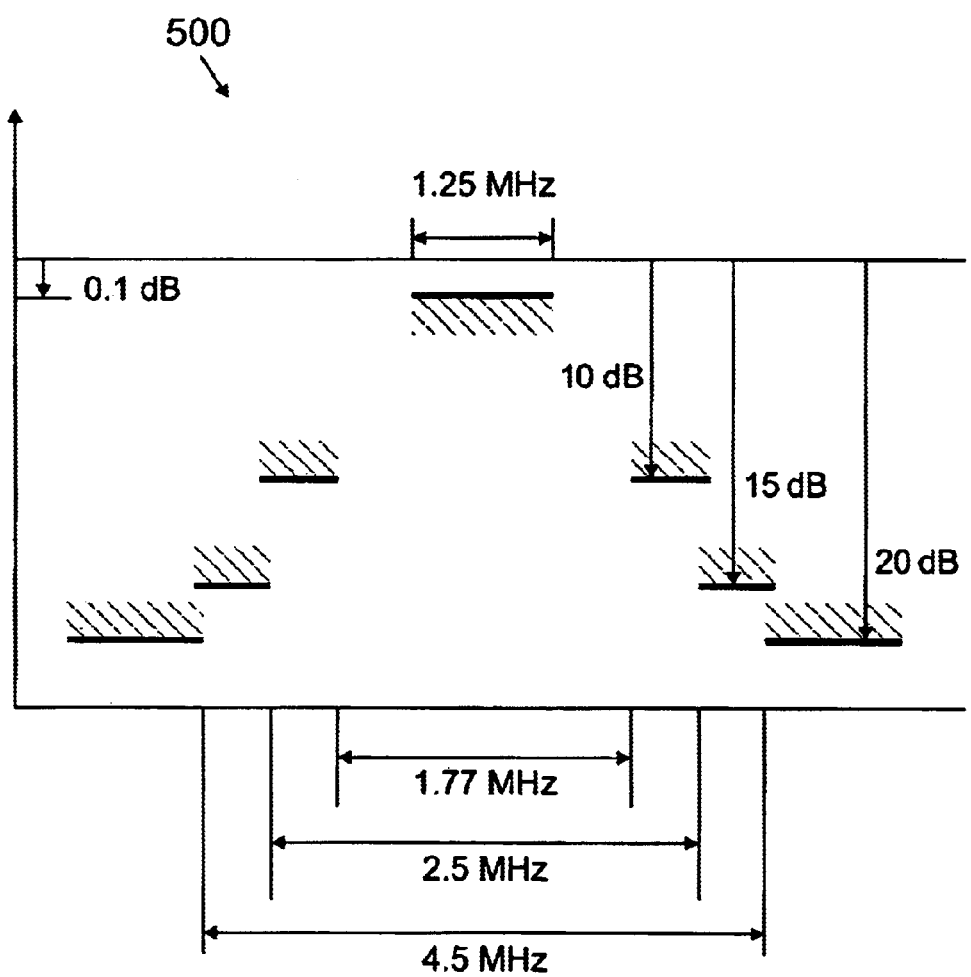
FIG. 5 depicts a frequency response diagram, which illustrates pre-distortion adjustments generate by the exemplary pre-distortion calculation controller, according to one embodiment of the present invention.

FIG. 5 depicts frequency response diagram 500, which illustrates pre-distortion adjustments generated by exemplary pre-distortion calculation controller 355 according to one embodiment of the present invention. The center 1.25 MHz band represents the full power signal within the designated traffic channel. The adjacent channels on both sides of the traffic channel are represented by reduced power level signals of −10 dB, −15 dB, and −20 dB. In all cases, the RF output signal is not to exceed the ACP profile. Thus, the ideal output signal is obtained by filtering the RF power level in the adjacent channels according to the digital filtering profile defined by the solid lines at the bottom of the shaded regions as shown in FIG. 5. It is noted that the digital filtering profile depicted in FIG. 5 is illustrative and other filtering profiles may readily be used.

Frequency response diagram 500 indicates that the reference or target signal has 10 dB, 15 dB, or 20 dB lower emissions than the distorted signal at frequency offsets of 885 kHz, 1.25MHz, or 2.24 MHz from the center traffic channel for a single CDMA carrier case, respectively. In other words, the new input signal will be distorted to produce an output signal that will have 10 dB, 15 dB, and 20 dB improvements in its spurious emission at the respective referenced frequency offset when compared to the output taken in the previous run.

Figure 6:
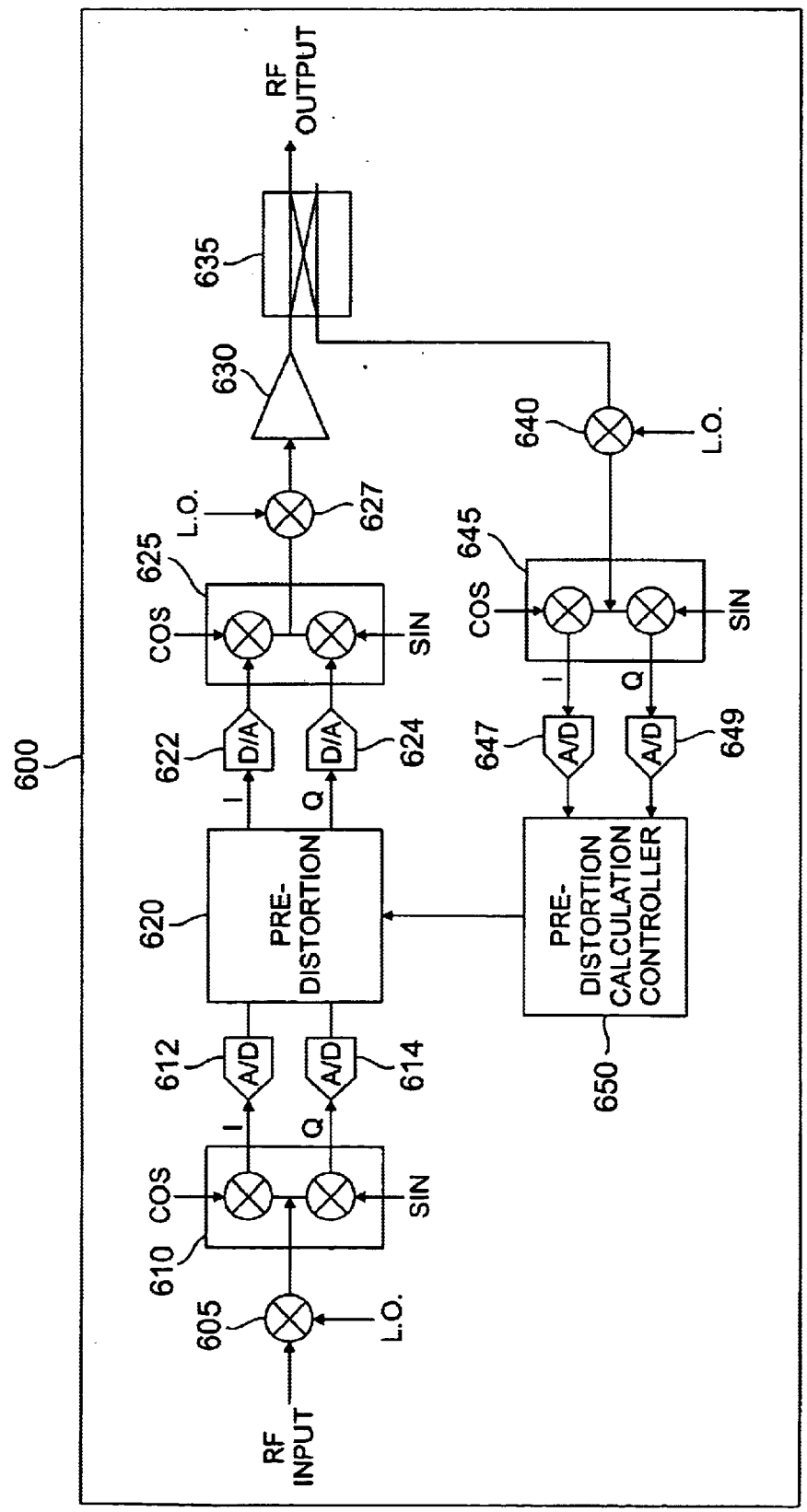
FIG. 6 illustrates selected portions of an exemplary RF transmitter for use in the exemplary base station according to an alternate embodiment of the present invention.

FIG. 6 illustrates selected portions of exemplary RF transmitter 600 for use in RF transceiver unit 250 according to an alternate embodiment of the present invention. RF transmitter 600 contains a transmit path that receives an RF input signal from the RF power amplifier driver (not shown) and generates an RF output signal that is sent to antenna array 255. Transmitter 600 is a baseband implementation of the direct digital pre-distortion technique according to the principles of the present invention. The transmit path elements in RF transmitter 600 comprise RF demodulator 605, IF demodulator 610, ADC 612, ADC 614, pre-distortion circuit 620, DAC 622, DAC 624, RF modulator 625, IF modulator 627, RF power amplifier (PA) 630, and RF coupler (RFC) 635.

RF transmitter 600 also contains a pre-distortion adjustment feedback loop that analyzes the RF output signal, compares the signal to the required ACP profile, and generates pre-distortion adjustment signals that are added to subsequent received baseband input signals. The pre-distortion correction feedback loop elements in RF transmitter 600 comprise RF demodulator 640, IF demodulator 645, ADC 647, ADC 649, and pre-distortion calculation controller 650.

RF demodulator 605 demodulates the received RF input signal using an RF local oscillator (LO) reference signal to thereby produce an analog IF signal. IF demodulator 610 demodulates the IF analog signal using an IF sine carrier signal and an IF cosine carrier signal to thereby produce an analog in-phase (I) baseband signal and an analog quadrature (Q) baseband signal.

ADC 612 and ADC 614 convert the analog I and Q baseband signals to digital I and Q baseband signals for subsequent processing by pre-distortion circuit 620. Pre-distortion circuit 620 adds pre-distortion error correction signals from distortion calculation controller 650 to the digital I and Q baseband signals to produce pre-distorted digital I and Q baseband signals for input to DAC 622 and DAC 624, respectively.

DAC 622 and DAC 624 convert the pre-distorted digital I and Q baseband signals to pre-distorted analog I and Q signals for input to IF modulator 625. IF modulator 625 uses cosine and sine IF carrier signals to generate a pre-distorted IF analog signal for input to RF modulator 627. RF modulator 627 modulates the predistorted distoreted IF analog signal to produce a pre-distorted RF output signal that is sent to PA 630. PA 630 amplifies the pre-distorted RF output signal to a power level suitable for transmission. The amplified RF output signal is then sent to antenna array 255 via RFC 635.

The pre-distortion adjustment signal for this baseband embodiment is generated in the feedback path comprising RF demodulator 640, IF demodulator 645, ADC 647, ADC 649, and pre-distortion calculation controller 650. A two stage demodulation is used to produce digital analog I and Q signals from the distorted RF output signal received from RFC 635. RF demodulator 640 demodulates the distorted RF output signal to produce an analog IF signal. IF demodulator 645 then demodulates the analog IF signal to produce an analog in-phase (I) baseband signal and an analog quadrature (Q) baseband signal.

Pre-distortion calculation controller 650 extracts the signal distortion introduced by PA 630, as represented by $\Delta I$ and $\Delta Q$, at every amplitude $A_m$, where $A_m$ is represented by the sum of the squares of I and Q. Pre-distortion calculation controller 650 comprises two signal paths, one each for the digitized I and Q baseband signals from ADC 647 and 649, respectively. Pre-distortion calculation controller 650 is similar to pre-distortion calculation controller 355, except that the I and Q baseband signals are filtered separately. Each filter path generates an ideal reference I or Q baseband signal for comparison with the distorted I or Q baseband signal. Pre-distortion calculation controller 650 provides the resultant $A_m$, $\Delta I$, and $\Delta Q$ signals as inputs to pre-distortion circuit 620.

Pre-distortion circuit 620 uses $A_m$, $\Delta I$, and $\Delta Q$ signals to locate corresponding distortion values in an internal look up table. Pre-distortion circuit 620 adjusts the digital I and Q baseband signals received from ADC 612 and ADC 614 according to the identified pre-distortion values retrieved from the look-up table (LUT) to generate pre-distorted digital I and Q baseband signals for transfer to DAC 622 and DAC 624.

Figure 7:
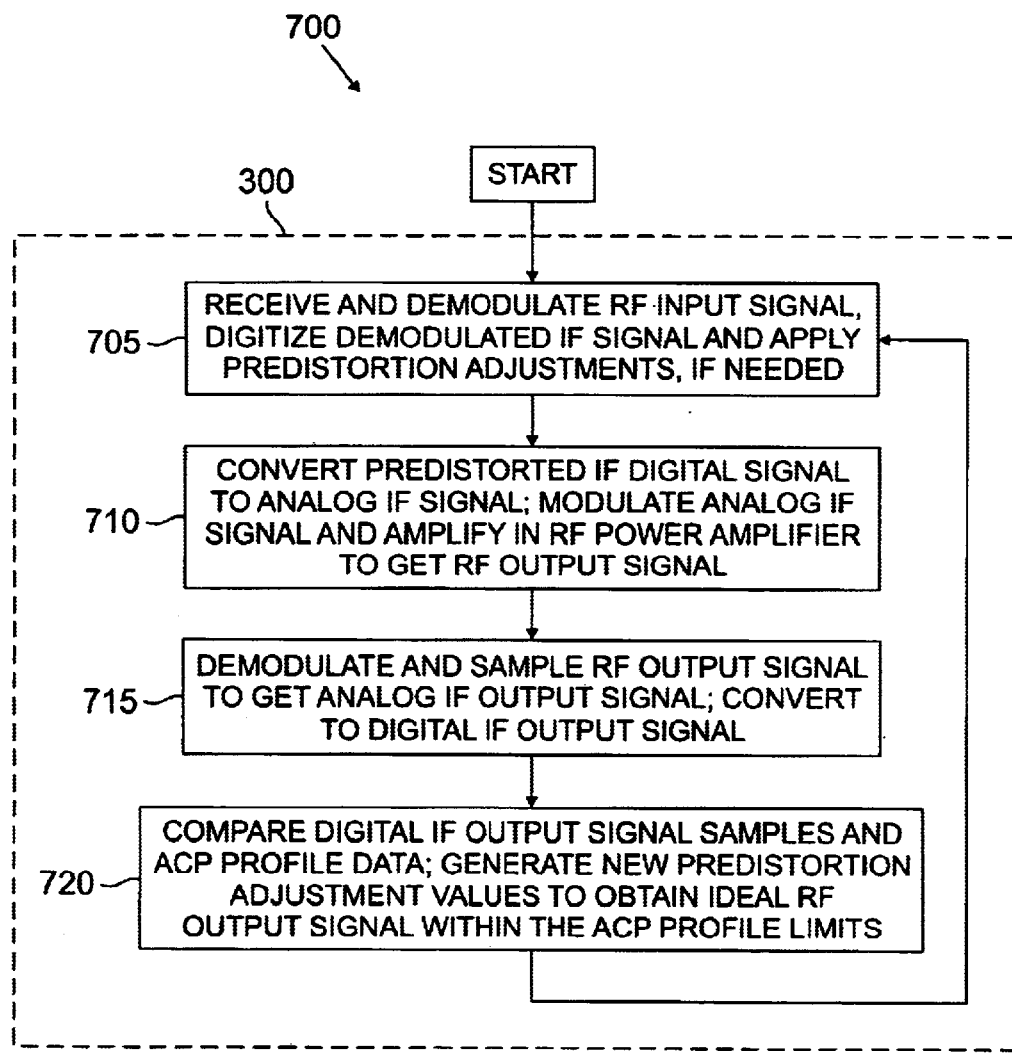
FIG. 7 is a flow diagram illustrating the overall operation of the exemplary RF transmitter according to one embodiment of the present invention.

FIG. 7 depicts flow diagram 700, which illustrates the overall operation of RF transmitter 300 according to one embodiment of the present invention. During routine operation of RF transmitter 300, demodulator 305 and ADC 310 demodulate and digitize the RF input signal to produce a digital IF signal. Pre-distortion circuit 315 makes pre-distortion adjustments to the digital IF signal, if needed (process step 705). The pre-distorted digital IF signal is converted to a pre-distorted analog IF signal. The analog IF signal is then modulated to produce a pre-distorted RF signal. The pre-distorted RF signal is then amplified is then amplified in RF power amplifier 320 (process step 710).

The resultant RF output signal is demodulated in demodulator 345 to recover the analog IF output signal which is then converted to a digital IF output by ADC 350 (process step 715). Pre-distortion calculation controller 355 compares samples of the resultant digital IF output signal with ACP profile data and generates new pre-distortion adjustment values which are output to pre-distortion circuit 315 (process step 720). Thereafter, the process repeats by looping back to process step 705, thereby giving the pre-distortion adjustment of transmitter 300 its adaptive nature. The pre-distortion adjustment values are constantly updated to compensate for changes in RF transmitter 300 over time.

Although the present invention has been described in detail, those skilled in the art should understand that they can make various changes, substitutions and alterations herein without departing from the spirit and scope of the invention in its broadest form.

What is claimed is:

1. For use in an RF transmitter having a transmit path capable of receiving and amplifying an RF input signal, a pre-distortion correction circuit for modifying distortion in said RF output signal caused by an RF power amplifier in said transmit path, said pre-distortion circuit comprising:

feedback circuitry coupled to an output of said transmit path capable of demodulating and digitizing said distorted RF output signal to thereby produce a first demodulated digital output signal; and a pre-distortion calculation controller coupled to said feedback circuitry capable of comparing only said first demodulated digital output signal with adjacent channel power (ACP) profile data associated with said pre-distortion calculation controller and generating therefrom pre-distortion correction values capable of being used to pre-distort said RF input signal to thereby cause said RF output signal to more closely resemble an ideal RF output signal within the limits of said ACP profile.

2. The pre-distortion adjustment circuit as set forth in claim 1 wherein said transmit path comprises demodulation circuitry capable of demodulating and digitizing said RF input signal to thereby produce a first demodulated digital input signal.

3. The pre-distortion adjustment circuit as set forth in claim 2 wherein said pre-distortion correction values are used to pre-distort said first demodulated digital input signal produced from said input RF signal.

4. The pre-distortion adjustment circuit as set forth in claim 2 wherein said feedback circuitry comprises a first intermediate frequency (IF) demodulator and said first demodulated digital output signal comprises a first digital IF output signal.

5. The pre-distortion adjustment circuit as set forth in claim 4 wherein said demodulation circuitry in said transmit path comprises a second intermediate frequency (IF) demodulator and said first demodulated digital input signal comprises a first digital IF input signal.

6. The pre-distortion adjustment circuit as set forth in claim 5 wherein said pre-distortion correction values are used to pre-distort said first digital IF input signal produced from said input RF signal.

7. The pre-distortion adjustment circuit as set forth in claim 2 wherein said feedback circuitry comprises a first baseband demodulator and said first demodulated digital output signal comprises a first digital baseband output signal.

8. The pre-distortion adjustment circuit as set forth in claim 7 wherein said demodulation circuitry in said transmit path comprises a second baseband demodulator and said first demodulated digital input signal comprises a first digital baseband input signal.

9. The pre-distortion adjustment circuit as set forth in claim 8 wherein said pre-distortion correction values are used to pre-distort said first digital baseband signal produced from said input RF signal.

10. A wireless network comprising a plurality of base stations capable of communicating with a plurality of mobile stations within a coverage area of said wireless network, at least one of said base station comprising:

an RF transmitter having a transmit path capable of receiving and amplifying an RF input signal; and a pre-distortion correction circuit for modifying distortion in said RF output signal caused by an RF power amplifier in said transmit path, said pre-distortion circuit comprising:

feedback circuitry coupled to an output of said transmit path capable of demodulating and digitizing said distorted RF output signal to thereby produce a first demodulated digital output signal; and a pre-distortion calculation controller coupled to said feedback circuitry capable of comparing only said first demodulated digital output signal with adjacent channel power (ACP) profile data associated with said pre-distortion calculation controller and generating therefrom pre-distortion correction values capable of being used to pre-distort said RF input signal to thereby cause said RF output signal to more closely resemble an ideal RF output signal within the limits of said ACP profile.

11. The wireless network as set forth in claim 10 wherein said transmit path comprises demodulation circuitry capable of demodulating and digitizing said RF input signal to thereby produce a first demodulated digital input signal.

12. The wireless network as set forth in claim 11 wherein said pre-distortion correction values are used to pre-distort said first demodulated digital input signal produced from said input RF signal.

13. The wireless network as set forth in claim 11 wherein said feedback circuitry comprises a first intermediate frequency (IF) demodulator and said first demodulated digital output signal comprises a first digital IF output signal.

14. The wireless network as set forth in claim 13 wherein said demodulation circuitry in said transmit path comprises a second intermediate frequency (IF) demodulator and said first demodulated digital input signal comprises a first digital IF input signal.

15. The wireless network as set forth in claim 14 wherein said pre-distortion correction values are used to pre-distort said first digital IF input signal produced from said input RF signal.

16. The wireless network as set forth in claim 11 wherein said feedback circuitry comprises a first baseband demodulator and said first demodulated digital output signal comprises a first digital baseband output signal.

17. The wireless network as set forth in claim 16 wherein said demodulation circuitry in said transmit path comprises a second baseband demodulator and said first demodulated digital input signal comprises a first digital baseband input signal.

18. The wireless network as set forth in claim 17 wherein said pre-distortion correction values are used to pre-distort said first digital baseband signal produced from said input RF signal.

19. For use in an RF transmitter having a transmit path capable of receiving and amplifying an RF input signal, a method of pre-distorting the input RF signal to correct distortion in an RF output signal caused by an RF power amplifier in the transmit path, the method comprising the steps of:

demodulating and digitizing the distorted RF output signal to thereby produce a first demodulated digital output signal; and comparing only the first demodulated digital output signal with adjacent channel power (ACP) profile data associated with the RF transmitter; and generating pre-distortion correction values capable of being used to pre-distort the RF input signal to thereby cause the RF output signal to more closely resemble an ideal RF output signal within the limits of the ACP profile.

20. The method as set forth in claim 19 further comprising the steps of demodulating and digitizing the RF input signal to thereby produce a first demodulated digital input signal.

21. The method as set forth in claim 20 wherein the pre-distortion correction values are used to pre-distort the first demodulated digital input signal produced from the input RF signal.

* * * * *